United States Patent
Beaudry et al.

(10) Patent No.: US 12,406,156 B2
(45) Date of Patent: Sep. 2, 2025

(54) METHOD AND SYSTEM FOR IMPRINTING UNIQUE IDENTIFIERS ON SEMICONDUCTOR DIES

(71) Applicant: Digitho Technologies Inc., Granby (CA)

(72) Inventors: Richard Beaudry, Granby (CA); Cédric Canu, Granby (CA); Maurice Delafosse, Granby (CA)

(73) Assignee: DIGITHO TECHNOLOGIES INC., Granby (CA)

( * ) Notice: Subject to any disclaimer, the term of this patent is extended or adjusted under 35 U.S.C. 154(b) by 38 days.

(21) Appl. No.: 18/093,730

(22) Filed: Jan. 5, 2023

(65) Prior Publication Data
US 2024/0143957 A1 May 2, 2024

Related U.S. Application Data

(60) Provisional application No. 63/421,612, filed on Nov. 2, 2022.

(51) Int. Cl.
*G06K 9/36* (2006.01)
*G03F 7/00* (2006.01)
(Continued)

(52) U.S. Cl.
CPC .......... *G06K 7/1417* (2013.01); *G03F 7/0002* (2013.01); *G06K 19/06037* (2013.01); *H01L 23/544* (2013.01); *H01L 2223/54413* (2013.01)

(58) Field of Classification Search
CPC ......... G06T 2207/30148; G03F 7/0002; G03F 7/70616; G06F 3/0679; G06K 19/06103; G06K 19/06037; H01L 23/544
(Continued)

(56) References Cited

U.S. PATENT DOCUMENTS 6,091,845 A * 7/2000 Pierrat ................ G03F 7/70483
716/52
6,830,941 B1 12/2004 Lee et al.
(Continued)

FOREIGN PATENT DOCUMENTS

JP 6185492 B2 8/2017
WO 2016/033232 A1 3/2016
(Continued)

OTHER PUBLICATIONS

International Search Report and Written Opinion in PCT/CA2023/050006 mailed Jul. 11, 2023, 11 pages.

*Primary Examiner* — Daniel St Cyr
(74) *Attorney, Agent, or Firm* — Haynes and Boone, LLP

(57) ABSTRACT

Various systems and methods for imprinting a unique identifier on a semiconductor die are disclosed herein. Example embodiments involve receiving a substrate at a photolithography station, the substrate including a photosensitive layer and an area for forming semiconductor dies, forming circuits on the substrate using a photolithography mask, imprinting a unique identifier on each semiconductor die on the substrate using a digital photomask and removing the substrate containing the semiconductor dies containing the circuits and the unique identifiers from the photolithography station. In some embodiments, each unique identifier is associated with a unique record for recording characteristics of the substrate, of the semiconductor die and of the unique identifier. In some embodiments, the digital photomask includes dynamically-controlled pixels, controllable to define a unique pattern for each unique identifier. In some embodiments, the unique identifier is a two-dimensional code.

28 Claims, 8 Drawing Sheets

(51) Int. Cl.
    *G06K 7/14*     (2006.01)
    *G06K 19/06*     (2006.01)
    *H01L 23/544*     (2006.01)

(58) Field of Classification Search
    USPC ................................ 235/462.1, 385, 462.09
    See application file for complete search history.

(56) References Cited

U.S. PATENT DOCUMENTS

| | | |
|---|---|---|
| 10,229,886 B2 | 3/2019 | Yu et al. |
| 10,431,551 B2 | 10/2019 | Butler et al. |
| 11,450,616 B2 | 9/2022 | Currier et al. |
| 11,506,984 B2 * | 11/2022 | Hsu ........................ G03F 7/705 |
| 2003/0008323 A1 * | 1/2003 | Ravkin .................. C07K 1/047 |
| | | 435/7.1 |
| 2004/0125346 A1 * | 7/2004 | Huibers ................. G03B 21/28 |
| | | 348/E5.142 |
| 2011/0259951 A1 | 10/2011 | Meyerson et al. |
| 2020/0328102 A1 | 10/2020 | Schepis et al. |
| 2020/0328103 A1 | 10/2020 | Fulford et al. |
| 2022/0037264 A1 | 2/2022 | Currier et al. |
| 2023/0018318 A1 * | 1/2023 | Hirano ............. G01N 21/95607 |
| 2023/0070048 A1 * | 3/2023 | Pain ........................ C25D 5/04 |
| 2023/0307241 A1 * | 9/2023 | Hsiao ................. H01L 21/3065 |
| 2023/0334214 A1 * | 10/2023 | Schaefer ................. G06F 30/39 |

FOREIGN PATENT DOCUMENTS

| | | | |
|---|---|---|---|
| WO | 2016/100560 A1 | 6/2016 | |
| WO | 2018/047981 A1 | 3/2018 | |
| WO | 201912499 | * 1/2019 | ........... G03F 9/7084 |

\* cited by examiner

METHOD AND SYSTEM FOR IMPRINTING UNIQUE IDENTIFIERS ON SEMICONDUCTOR DIES

CROSS REFERENCE TO RELATED APPLICATION

This application claims priority to U.S. Provisional Application No. 63/421,612, filed on Nov. 2, 2022, which is incorporated by reference.

FIELD

The various embodiments described herein generally relate to one or more systems and methods for imprinting unique identifiers on semiconductor dies.

BACKGROUND

Semiconductor dies are integrated circuits used in a wide range of applications including microprocessors, system-on-chips, signal processors and amplifiers. With the increase in use of integrated circuits in various industries and the associated multiplication of suppliers for components, traceability of semiconductor dies has become more complex.

The ability to trace semiconductor dies or products containing semiconductor dies can have important uses in supply chain forecasting and in fault detection. When accurate, relevant and timely data about semiconductor dies is collected, high-value decisions can be more made more easily. These decisions can have significant impacts on the profitability and delivery of semiconductors and on the fulfillment of contractual obligations.

Currently, the primary method used for supply chain forecasting involves relying on feedback from semiconductor fabrication units. The feedback can be ad-hoc, or can require a series of complex systems, databases and processes, which can be unreliable and limited by constraints imposed by communication channels.

SUMMARY OF VARIOUS EMBODIMENTS

The various embodiments described herein generally relate to systems and methods for imprinting a unique identifier on a semiconductor die.

According to one broad aspect of the teachings herein, there is provided a method for imprinting a unique identifier on a semiconductor die. The method involves receiving the substrate at a photolithography station, the substrate comprising a photosensitive layer and an area for forming a plurality of semiconductor dies; forming a plurality of circuits on the substrate using at least one photolithography mask, each circuit corresponding to a semiconductor die; imprinting the unique identifier on each semiconductor die on the substrate using at least one digital photomask; and removing the substrate comprising the plurality of semiconductor dies, each semiconductor die comprising the circuit and the unique identifier from the photolithography station.

In some embodiments, the method involves associating the unique identifier with a unique record for the semiconductor die.

In some embodiments, the at least one digital photomask comprises dynamically controlled pixels, controllable to define a unique pattern for the unique identifier.

In some embodiments, the method involves determining one or more of a position and a size of the unique identifier based on one or more of a position of the circuit and a pattern of the circuit on each of the semiconductor dies.

In some embodiments, the record includes an origin of the substrate, a lot of the semiconductor die, a lot of the substrate, a batch for the semiconductor die, a batch for the substrate, a position of the semiconductor die on the substrate, a size of the die, one or more dimensions for the unique identifier, a thickness of the unique identifier, a position of the unique identifier on the semiconductor die, a type of material for the unique identifier, and/or a fabrication history of the semiconductor die.

In some embodiments, imprinting the unique identifier involves imprinting a unique two-dimensional code.

In some embodiments, the unique two-dimensional code is a data matrix code, a QR code, an Aztec code, a flashcode or a Semacode.

In some embodiments, imprinting the unique identifier imprinting the unique identifier comprises imprinting the unique identifier on a thin film comprising at least a portion of the circuit.

In accordance with another embodiment, there is provided a system for imprinting a unique identifier on a semiconductor die. The system comprises: a processor operable to determine the unique identifier on the semiconductor die; a database in communication with the processor for storing a record associated with the unique identifier; and a photolithography station in communication with the processor. The photolithography station is configured to: receive a substrate comprising a photosensitive layer and an area for forming a plurality of semiconductor dies; form a plurality of circuits on the substrate using at least one photolithography mask, each circuit corresponding to a semiconductor die; imprint the unique identifier on each semiconductor die on the substrate using at least one digital photomask; and remove the substrate comprising the plurality of semiconductor dies, each semiconductor die comprising the circuit and the unique identifier from the photolithography station.

In at least one embodiment, the at least one digital photomask comprises dynamically controlled pixels and the processor is operable to control the pixels of the digital photomask to define a unique pattern for the unique identifier.

In at least one embodiment, the processor is further operable to determine one or more of a position and a size of the unique identifier based on one or more of a position of the circuit and a pattern of the circuit for each of the semiconductor dies.

In at least one embodiment, imprinting the unique identifier on each semiconductor die comprises imprinting the unique identifier on an outer periphery of the semiconductor die.

In at least one embodiment, the record comprises one or more of: an origin of the substrate, a lot of the semiconductor die, a lot of the substrate, a batch for the semiconductor die, a batch for the substrate, a position of the semiconductor die on the substrate, a size of the die, one or more dimensions for the unique identifier, a position of the unique identifier on the semiconductor die, a thickness of the unique identifier, a type of material for the unique identifier, and a fabrication history of the semiconductor die.

In at least one embodiment, imprinting the unique identifier comprises imprinting a unique two-dimensional code.

In at least one embodiment, the unique two-dimensional code is one of a data matrix code, a QR code, an Aztec code, a flashcode and a Semacode.

In at least one embodiment, imprinting the unique identifier comprises imprinting the unique identifier on a thin film comprising at least a portion of the circuit.

In accordance with another embodiment, there is provided a method for imprinting a unique identifier on a semiconductor die. The method comprises: receiving the substrate at a photolithography station, the substrate comprising a photosensitive layer and an area for forming a plurality of semiconductor dies; imprinting a pattern onto the substrate using at least one digital photomask, the pattern defining a circuit for each semiconductor die and a unique identifier for each semiconductor die; and removing the substrate from the photolithography station, the substrate comprising the plurality of semiconductor dies, each semiconductor die comprising the circuit and the unique identifier.

In at least one embodiment, the at least one digital photomask comprises dynamically controlled pixels, controllable to define a unique pattern for the unique identifier.

In at least one embodiment, the at least one digital photomask further comprises at least one region defining a static pattern of pixels.

In at least one embodiment, the method comprises determining one or more of a position and a size of the unique identifier based on one or more of a position of the circuit and a pattern of the circuit for each of the semiconductor dies.

In at least one embodiment, imprinting the pattern comprises the circuit and the unique identifier on each semiconductor die comprises imprinting the unique identifier on an outer periphery of the semiconductor die.

In at least one embodiment, the record comprises one or more of: an origin of the substrate, a lot of the semiconductor die, a lot of the substrate, a batch for the semiconductor die, a batch for the substrate, a position of the semiconductor die on the substrate, a size of the die, one or more dimensions for the unique identifier, a thickness of the unique identifier, a position of the unique identifier on the semiconductor die, a type of material for the unique identifier, and a fabrication history of the semiconductor die.

In at least one embodiment, the unique identifier is a unique two-dimensional code.

In at least one embodiment, the unique two-dimensional code is one of a data matrix code, a QR code, an Aztec code, a flashcode and a Semacode.

In accordance with another embodiment, there is provided a system for imprinting a unique identifier on a semiconductor die. The system comprises: a processor operable to determine the unique identifier on the semiconductor die; a database in communication with the processor for storing a record associated with the unique identifier; and a photolithography station in communication with the processor. The photolithography station configured to: receive the substrate, the substrate comprising a photosensitive layer and an area for forming a plurality of semiconductor dies; imprint a pattern onto the substrate using a digital photomask, the pattern defining a circuit for each semiconductor die and a unique identifier for each semiconductor die; and remove the substrate from the photolithography station, the substrate comprising the plurality of semiconductor dies, each semiconductor die comprising the circuit and the unique identifier.

In at least one embodiment, the at least one digital photomask comprises dynamically controlled pixels, and wherein the processor is operable to control the pixels to define a unique pattern for the unique identifier.

In at least one embodiment, the at least one digital photomask further comprises at least one region defining a static pattern of pixels.

In at least one embodiment, the processor is further operable to determine one or more of a position and a size of the unique identifier based on one or more of a position of the circuit and a pattern of the circuit for each of the semiconductor dies.

In at least one embodiment, imprinting the pattern defining the circuit and the unique identifier comprises imprinting the unique identifier on an outer periphery of the semiconductor die.

In at least one embodiment, the record comprises one or more of: an origin of the substrate, a lot of the semiconductor die, a lot of the substrate, a batch for the semiconductor die, a batch for the substrate, a position of the semiconductor die on the substrate, a size of the die, one or more dimensions for the unique identifier, a thickness of the unique identifier, a position of the unique identifier on the semiconductor die, a type of material for the unique identifier, and a fabrication history of the semiconductor die.

In at least one embodiment, the unique identifier is a unique two-dimensional code.

In at least one embodiment, the unique two-dimensional code is one of a data matrix code, a QR code, an Aztec code, a flashcode and a Semacode.

In accordance with another embodiment, there is provided a method for accessing a record associated with a semiconductor die. The method involves identifying a unique identifier for the semiconductor die, the unique identifier imprinted on the semiconductor die; determining at least one physical characteristic of the unique identifier; providing the unique identifier and the at least one physical characteristic to a database comprising the record; determining, at the database, if the record associated with the unique identifier comprises the determined at least one physical characteristic; and in response to determining that the record associated with the unique identifier comprises the determined at least one physical characteristic, providing access to the record.

In some embodiments, the at least one physical characteristic is one of: a position of the unique identifier on the semiconductor die, a thickness of the unique identifier, and dimensions of the unique identifier.

It will be appreciated that the foregoing summary sets out representative aspects of embodiments to assist skilled readers in understanding the following detailed description. Other features and advantages of the present application will become apparent from the following detailed description taken together with the accompanying drawings. It should be understood, however, that the detailed description and the specific examples, while indicating preferred embodiments of the application, are given by way of illustration only, since various changes and modifications within the spirit and scope of the application will become apparent to those skilled in the art from this detailed description.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment, and which are now described. The drawings are not intended to limit the scope of the teachings described herein.

Figure 1:
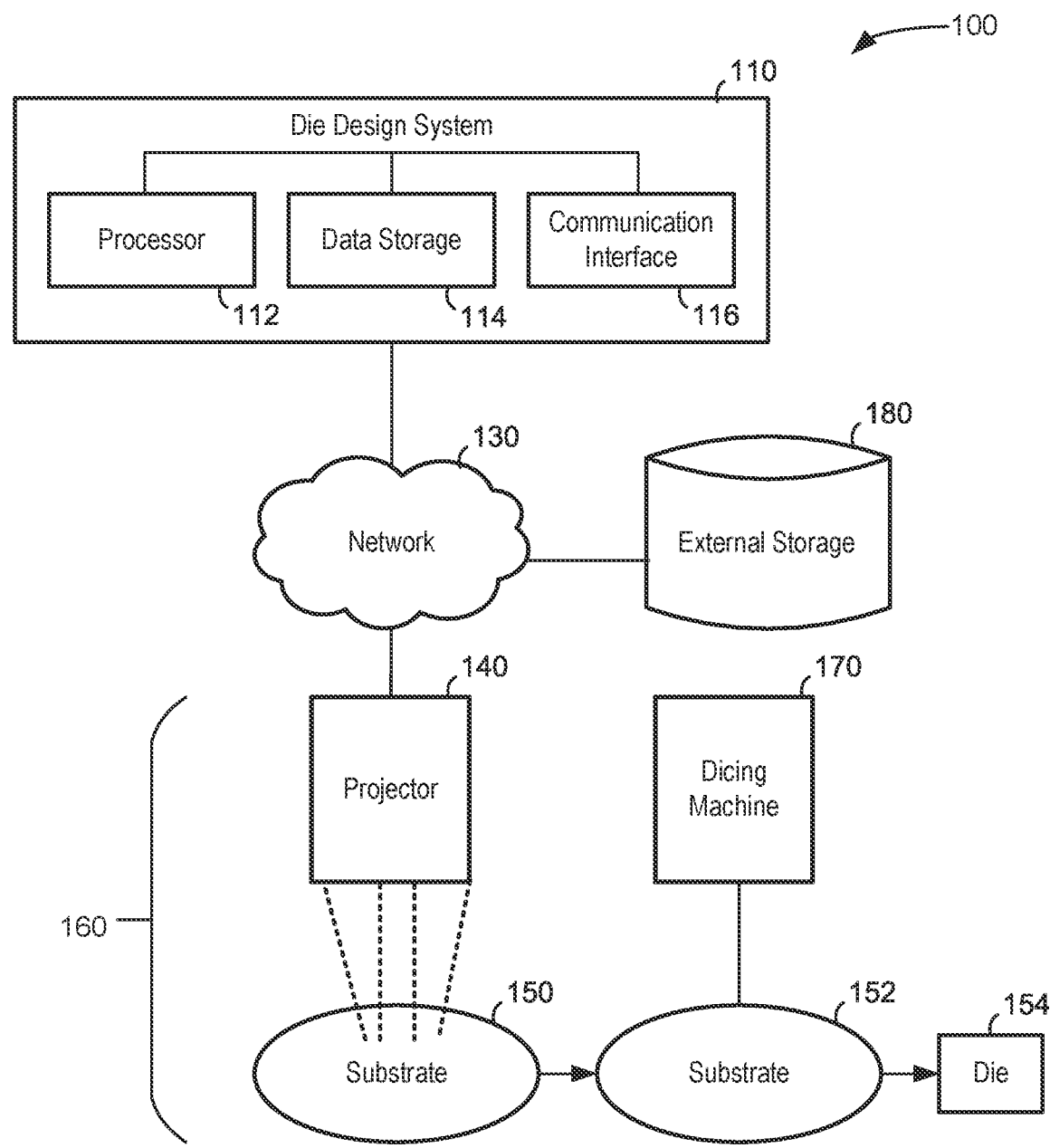
FIG. 1 is a block diagram of an example embodiment of a system for manufacturing semiconductor dies.

Further aspects and features of the example embodiments described herein will appear from the following description taken together with the accompanying drawings.

DETAILED DESCRIPTION OF THE EMBODIMENTS

The headings and Abstract of the Disclosure provided herein are for convenience only and do not interpret the scope or meaning of the embodiments.

Various embodiments in accordance with the teachings herein will be described below to provide examples of at least one embodiment of the claimed subject matter. No embodiment described herein limits any claimed subject matter. The claimed subject matter is not limited to devices, systems or methods having all of the features of any one of the devices, systems or methods described below or to features common to multiple or all of the devices, systems or methods described herein. It is possible that there may be a device, system or method described herein that is not an embodiment of any claimed subject matter. Any subject matter that is described herein that is not claimed in this document may be the subject matter of another protective instrument, for example, a continuing patent application, and the applicants, inventors or owners do not intend to abandon, disclaim or dedicate to the public any such subject matter by its disclosure in this document.

Furthermore, it will be appreciated that for simplicity and clarity of illustration, where considered appropriate, reference numerals may be repeated among the figures to indicate corresponding or analogous elements or steps. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

It should also be noted that the terms "coupled" or "coupling" as used herein can have several different meanings depending in the context in which these terms are used. For example, the terms coupled or coupling can have a mechanical, electrical or communicative connotation. For example, as used herein, the terms coupled or coupling can indicate that two elements or devices can be directly connected to one another or connected to one another through one or more intermediate elements or devices via an electrical element, electrical signal or a mechanical element depending on the particular context.

Unless the context requires otherwise, throughout the specification and claims which follow, the word "comprise" and variations thereof, such as, "comprises" and "comprising" are to be construed in an open, inclusive sense, that is, as "including, but not limited to".

Various terms used throughout the present description may be read and understood as follows, unless the context indicates otherwise: singular articles and pronouns as used throughout include their plural forms, and vice versa. Further definitions for terms may be set out herein; these may apply to prior and subsequent instances of those terms, as will be understood from a reading of the present description.

It should also be noted that, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should be noted that terms of degree such as "substantially", "about" and "approximately" as used herein mean a reasonable amount of deviation of the modified term such that the end result is not significantly changed. These terms of degree may also be construed as including a deviation of the modified term if this deviation does not negate the meaning of the term it modifies.

Furthermore, the recitation of numerical ranges by endpoints herein includes all numbers and fractions subsumed within that range (e.g., 1 to 5 includes 1, 1.5, 2, 2.75, 3, 3.90, 4, and 5). It is also to be understood that all numbers and fractions thereof are presumed to be modified by the term "about" which means a variation of up to a certain amount of the number to which reference is being made if the end result is not significantly changed, such as 1%, 2%, 5%, or 10%, for example.

Reference throughout this specification to "one embodiment", "an embodiment", "at least one embodiment" or "some embodiments" means that one or more particular features, structures, or characteristics may be combined in any suitable manner in one or more embodiments, unless otherwise specified to be not combinable or to be alternative options.

As used in this specification and the appended claims, the singular forms "a," "an," and "the" include plural referents unless the content clearly dictates otherwise. It should also be noted that the term "or" is generally employed in its broadest sense, that is, as meaning "and/or" unless the content clearly dictates otherwise.

It should be noted that unless otherwise specified, the terms "substrate" and "wafer" are used interchangeably in this specification.

A portion of the example embodiments of the systems, devices, or methods described in accordance with the teachings herein may be implemented as a combination of hardware or software. For example, a portion of the embodiments described herein may be implemented, at least in part, by using one or more computer programs, executing on one or more programmable devices comprising at least one processing element, and at least one data storage element (including volatile and non-volatile memory). These devices may also have at least one input device (e.g., a keyboard, a mouse, a touchscreen, and the like) and at least one output device (e.g., a display screen, a printer, a wireless radio, and the like) depending on the nature of the device.

It should also be noted that there may be some elements that are used to implement at least part of the embodiments described herein that may be implemented via software that is written in a high-level procedural language such as object-oriented programming. The program code may be written in C, C++ or any other suitable programming language and may comprise modules or classes, as is known to those skilled in object-oriented programming. Alternatively, or in addition thereto, some of these elements implemented via software may be written in assembly language, machine language, or firmware as needed.

At least some of the software programs used to implement at least one of the embodiments described herein may be stored on a storage media or a device that is readable by a general or special purpose programmable device. The software program code, when read by the programmable device, configures the programmable device to operate in a new, specific and predefined manner in order to perform at least one of the methods described herein.

Furthermore, at least some of the programs associated with the systems and methods of the embodiments described herein may be capable of being distributed in a computer program product comprising a computer readable medium that bears computer usable instructions, such as program code, for one or more processors. The program code may be preinstalled and embedded during manufacture and/or may be later installed as an update for an already deployed computing system. The medium may be provided in various forms, including non-transitory forms such as, but not limited to, one or more diskettes, compact disks, tapes, chips, and magnetic and electronic storage. In alternative embodiments, the medium may be transitory in nature such as, but not limited to, wire-line transmissions, satellite transmissions, internet transmissions (e.g., downloads), media, digital and analog signals, and the like. The computer useable instructions may also be in various formats, including compiled and non-compiled code.

Accordingly, any module, unit, component, server, computer, terminal or device described herein that executes software instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information, and which can be accessed by an application, module, or both. Any such computer storage media may be part of the device or accessible or connectable thereto.

Existing techniques for identifying microchips containing semiconductor dies involve tracking the batch number or the wafer number of each die. However, these techniques do not allow for tracing individual dies and therefore can be ill-suited for tracing microfabrication defects or microfabrication non-uniformity. Further, these techniques make distinguishing between packaging-induced and micro-processing-induced defects or variations difficult, as they do not allow for identification of individual dies.

Other existing techniques involve assigning virtual or physical identifiers to wafers and tracking individual dies based on the order they are extracted from the wafers and in some cases, placing identifiers on die packaging. However, these techniques can be imprecise, prone to error, and can require repeated verification. For example, when dies are extracted from wafers and packaged, manipulation errors can occur, and dies may be misplaced or mixed. Resolving these pick and place errors can pose challenges.

Still other existing techniques involve fusing resistors or transistors within a matrix of transistors to generate open circuits within the matrix, thereby generating an identifiable pattern in digital memory. Similar techniques involve placing an integrated circuit memory block on a die and using natural variations during processing of the semiconductor to produce an identifying matrix. However, these techniques can only be applied to digital micro-circuits, can degrade overtime, and fail when the digital circuit is damaged.

Described herein are various example embodiments that may be used for encoding a unique identifier on a semiconductor die. The use of unique identifiers on semiconductor dies can improve traceability of microchips and can allow for failure detection and improved quality control.

The disclosed methods and systems can involve imprinting a unique identifier during the manufacturing process of a semiconductor die before the substrate is singulated, using techniques, devices and/or machines used for patterning circuits on a substrate. The unique identifier can be imprinted as a two-dimensional bar code and can be associated with a record that may be used to record data about the semiconductor die and/or events related to its fabrication and/or use. The position and the size of the unique identifier may be determined based on the design (e.g., the size, the location, the type, the physical design) of the circuit pattern imprinted on the semiconductor die and may be selected to minimize interference with the circuit. The unique identifier and in some cases, the circuits can be imprinted on the substrate using digital photomask(s).

At least some of the embodiments described herein can use existing components, machines and/or devices used in the manufacturing of semiconductor dies to imprint the unique identifier onto semiconductor dies and can accordingly provide cost-effective methods for imprinting the unique identifier. At least some of the embodiments described herein can imprint the unique identifier during the normal manufacturing process of a semiconductor die using conventional equipment.

Imprinting an identifier on a semiconductor die can allow for improved traceability of the semiconductor microchip on which the semiconductor die resides. For example, information relating to the origin or the fabrication history of the semiconductor die can be associated with the identifier and provided on a database, which may be accessed by actors involved in the life cycle of the semiconductor die. Traceability can be used for example, to comply with export regulations. As an example, different geographical regions or countries may have different requirements for semiconductor microchips and may require semiconductor microchips to comply with specific standards, regulations, restrictions, taxation requirements and/or quality control requirements. When a microchip is intercepted, the unique identifier imprinted on the semiconductor die may be read and may provide information about the microchip that may be useful in determining regulatory compliance. Accordingly, imprinting a unique identifier on a semiconductor can allow for weaknesses in the supply chain and/or the reselling network to be identified.

Further, imprinting an identifier on a semiconductor die can aid in verifying the authenticity of semiconductor dies and/or products containing semiconductor dies. In many cases, recycled, previously used, or illegitimate (for example, semiconductor packaging with erased information for meeting qualification requirements) semiconductor microchips which may not comply with regulations, standards of quality or guarantees provided by the original manufacturer are sold to buyers. When the identifier is read, information about the semiconductor die can be retrieved and assist in determining authenticity of the die.

At least some of the embodiments described herein provide a cost-effective system and/or method for imprinting a durable unique identifier on a semiconductor die that minimizes the risk of damage to the functionalities of the semiconductor die, which can allow for increased yield and viability. For example, the unique identifier may be imprinted on a functional film of the die and be sealed through the regular manufacturing process of semiconductor dies, reducing the risk of tampering or removal. Further, the unique identifier may be imprinted on a photoresist and then transferred into a constitutive layer such as a thin film through an etching process, as is typically used in the fabrication of semiconductor dies. Typical constitutive layers use silicon compounds, which may withstand high temperatures, for example, above 900° C.-1300° C., and accordingly, the unique identifier may withstand damage due to electric fires.

The various example embodiments described herein can provide improvements to the supply chain management and forecasting and production planning of semiconductor microchips and of devices comprising semiconductor microchips. For example, based on the number of dies comprised within a wafer and the time of manufacture of the dies, it may be possible to estimate the production timeline for a die, for example, from the manufacturing stage to the end product stage. The various example embodiments described herein can establish a record for a semiconductor die, which may be accessible to stakeholders involved in the process of fabrication, assembly and use of the semiconductor dies and/or the semiconductor microchips on which the semiconductor dies reside, and end users.

Referring now to FIG. 1, shown therein is a block diagram 100 of a system 100 for manufacturing a semiconductor die. The system 100 includes a die design system 110, in communication with a photolithography station 160 via a network 130, a singulation machine 160 and an external data storage 180. The system 100 is provided as an example and there can be other embodiments of the system 100 with different components or a different configuration of the components described herein. In particular, there can be embodiments of the system 100 with a greater number of components, and each component shown in FIG. 1 may be further subdivided into a number of different components. It will also be understood that the manufacturing of a semiconductor die may involve steps performed by components not shown in FIG. 1 for simplicity.

The die design system 110 comprises a processor 112, a data storage 114 and a communication interface 116. The die design system 110 may be a personal computer, a workstation, a server, a portable computer, an electronic tablet device, a laptop, or any other electronic device that can allow for the design of a die to be created. The die design system 110 can be implemented with more than one computer server distributed over a wide geographic area and connected via the network 130. The processor 112, the data storage 114 and the communication interface 116 may be combined into a fewer number of components or may be separated into further components.

The processor 112 can be implemented with any suitable processor, controller, digital signal processor, graphics processing unit, application specific integrated circuits (ASICs), and/or field programmable gate arrays (FPGAs) that can provide sufficient processing power for the configuration, purposes and requirements of the die design system 110. The processor 112 can include more than one processor with each processor being configured to perform different dedicated tasks. The processor 112 can be configured to determine information related to patterns to be formed on substrates, including but not limited to physical and functional characteristics of the circuit patterns, physical characteristics of the unique identifiers, including the position and size of the unique identifiers. In some cases, the processor 112 may be operable to control the operation of the photomasks used by the photolithography station 160.

The communication interface 116 can include any interface that enables the die design system 110 to communicate with various devices and other systems and the network 130. For example, the communication interface 116 can receive a design for a die and store the design in the data storage 114 or an external storage. In some embodiments, die design system 110 can itself be used for designing a die.

The communication interface 116 can include at least one of a serial port, a parallel port or a USB port, in some embodiments. The communication component 116 may also include an interface to component via one or more of an Internet, Local Area Network (LAN), Ethernet, Firewire, modem, fiber, or digital subscriber line connection. Various combinations of these elements may be incorporated within the communication interface 116. For example, the communication interface 116 may receive input from various input devices, such as a mouse, a keyboard, a touch screen, a thumbwheel, a track-pad, a track-ball, a card-reader, voice recognition software and the like depending on the requirements and implementation of the die design system 110.

The data storage 114 can include RAM, ROM, one or more hard drives, one or more flash drives or some other suitable data storage elements such as disk drives. The data storage 114 can include one or more databases for storing designs for dies, information related to the design of the dies, of the composition of the substrate and/or of the photosensitive films and/or information related to the fabrication history of dies.

In some embodiments, the data storage 114 can be used to store an operating system and programs. For instance, the operating system provides various basic operational processes for the processor 112. The programs include various user programs so that a user can interact with the processor 112 to perform various functions such as, but not limited to, viewing and/or designing dies. For example, the programs may include design programs for designing dies. The data storage 114 can also be used to store information about dies. For example, the data storage can store information relating to the die including, but not limited to a batch number of a specific die, a wafer substrate origin, a batch origin, events relating to the fabrication history of the die and any other information that may improve traceability of the die. The data storage 114 can also store photomask patterns and/or operational information for configuring photomasks.

The external data storage 180 can store data similar to that of the data storage 114, in particular data relating to dies, for example, records for the semiconductor dies. The external data storage 180 may be accessible remotely by computing devices (not shown) via the network 130. In at least one embodiment, the external data storage 180 may be a secured data storage that may be accessible by authorized users. For example, the external data storage 180 may be accessible through a platform and each user may be associated with a profile that may allow the user to view and/or modify records associated with the semiconductor dies. Access may be limited, for example, based on a type of user.

The network 130 can include any network capable of carrying data, including the Internet, Ethernet, plain old telephone service (POTS) line, public switch telephone network (PSTN), integrated services digital network (ISDN), digital subscriber line (DSL), coaxial cable, fiber optics, satellite, mobile, wireless (e.g. Wi-Fi, WiMAX), SS7 signaling network, fixed line, local area network, wide area network, and others, including any combination of these, capable of interfacing with, and enabling communication between, the die design system, the external data storage 180 and the projector 140.

The photolithography station 160 includes a projector 140. The projector 140 can include any machine capable of imprinting a pattern of material over a substrate 150, including a pattern for a circuit for producing a semiconductor die. For example, the projector 140 may be any type of machine or device that uses photolithography techniques for producing the pattern of material and may include one or more light sources and a combination of lenses and mirrors. The projector 140 may receive a design for a semiconductor die and/or for a substrate from the die design system 110 via the network 130.

The dicing machine 170 can include any machine used for separating dies 154 from a substrate 152 following the process of imprinting the die pattern on the substrate 152 and can include any combination of mechanical sawing, breaking and/or laser cutting. While only one die 154 is shown in FIG. 1 for simplicity, it will be understood that the substrate 152 may be separated into a plurality of dies 154.

Figure 2:
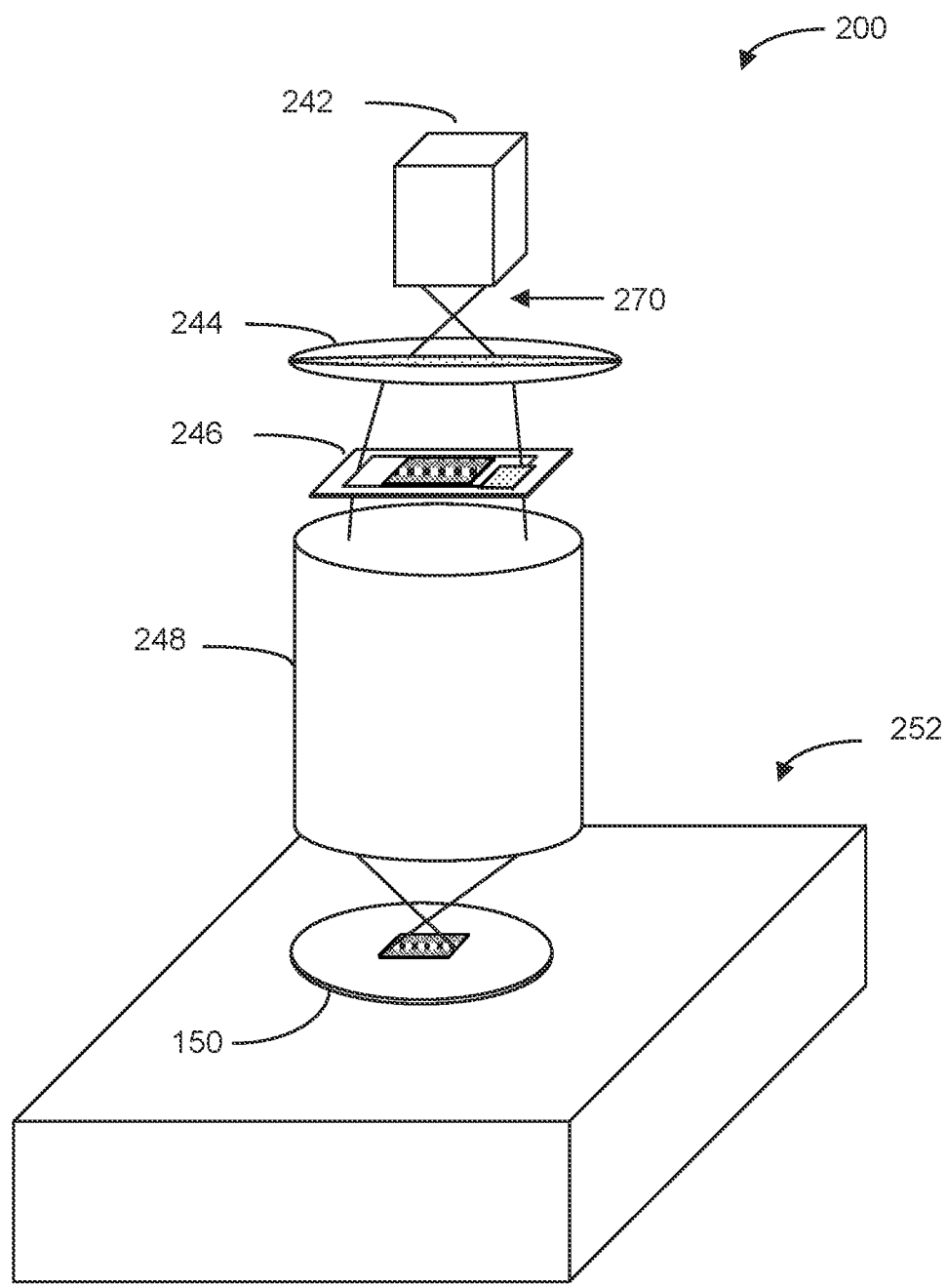
FIG. 2 is a schematic diagram of a photolithography station of the system for manufacturing semiconductor dies of FIG. 1.

Referring now to FIG. 2, shown therein is a schematic diagram of a photolithography station 200 in accordance with an embodiment. The photolithography station can correspond to the photolithography station 160 of FIG. 1.

The photolithography station 200 includes a light source 242 producing an optical path 270, a lens 244, a photomask 246, an optical column 248 and an alignment stage 252 for aligning the substrate received at the station 200 with the optical components of the station.

Figure 7:
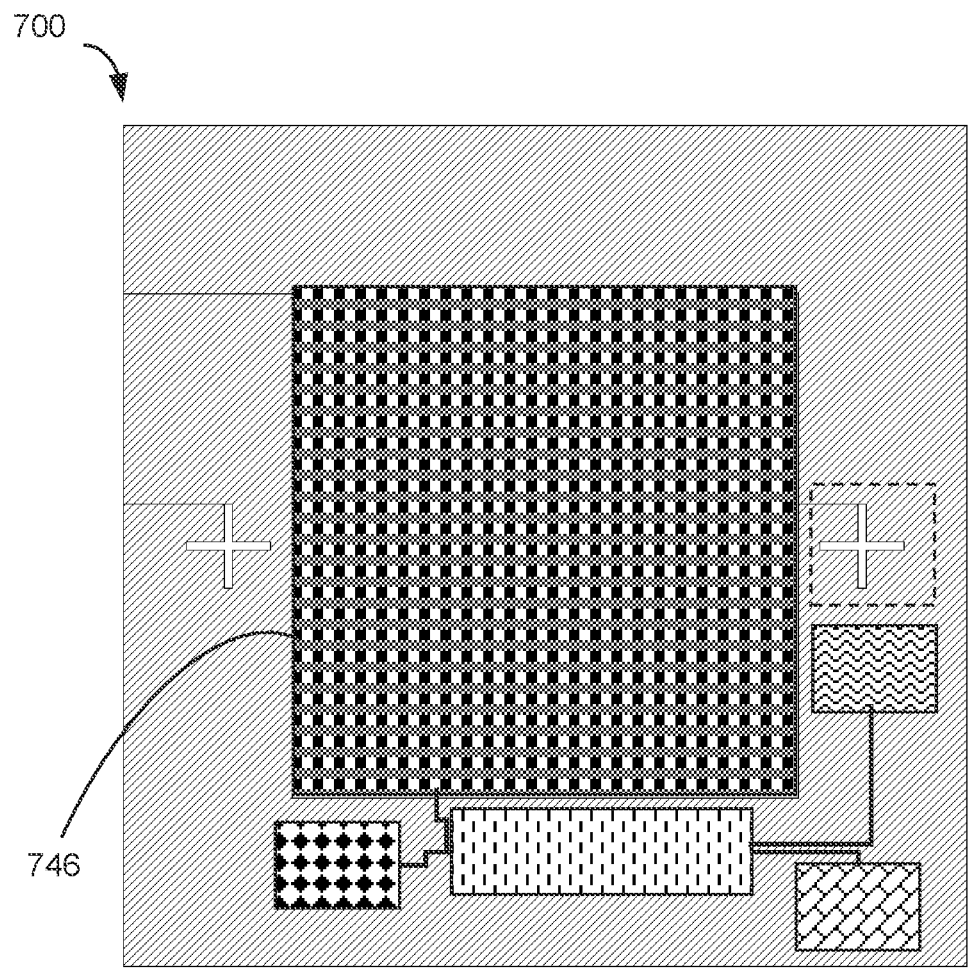
FIG. 7 is a schematic diagram of an example digital photomask in accordance with the present disclosure.

The photomask 246 can be a digital photomask and may be in communication with processor(s) (not shown) operable to send information to the photomask 246 for configuring the photomask 246, for example, pattern files and timing information for synchronizing the photomask 246 with the actions of other components of the photolithography station 200 (e.g., the light source 242, the alignment stage 252). The processor(s) can be processor 112 or a separate processor. The digital photomask can be a digitally controllable array of pixels capable of producing a pattern. For example, the array of pixels can be made of micro-shutters dynamically configurable by a processor to transmit (i.e., an ON state) or not transmit light (i.e., an OFF state). The processor can control the array of pixels to define a pattern during the photolithography process, for example, prior to imprinting each unique identifier. The processor operable to control the array of pixels may be a processor in communication with the processor operable to determine patterns for the unique identifiers and for synchronizing the photomask or may be the same processor. In at least some embodiments, the photomask 246 is dimensioned such that it can be used with conventional photolithography equipment (e.g., in place of conventional photomasks). Referring briefly to FIG. 7, which shows an example digital photomask 700, each pixel of the array of pixels 746 can be individually controlled, such that a pattern is formed when the photomask 700 is exposed to light from a light source, such as light source 242.

In some embodiments, the photomask 246 can additionally include region(s) defining a static pattern of pixels. For example, the pixels within the region(s) defining the static pattern may remain unchanged during the photolithography process. The pixels may correspond to pixels which have been pre-programmed to remain unchanged. Alternatively, the pixels may be pixels which are not programmable. For example, the photomask 246 may include conventional (i.e., non-programmable, passive) photomask regions and dynamic (i.e., programmable, active) regions.

Figure 3:
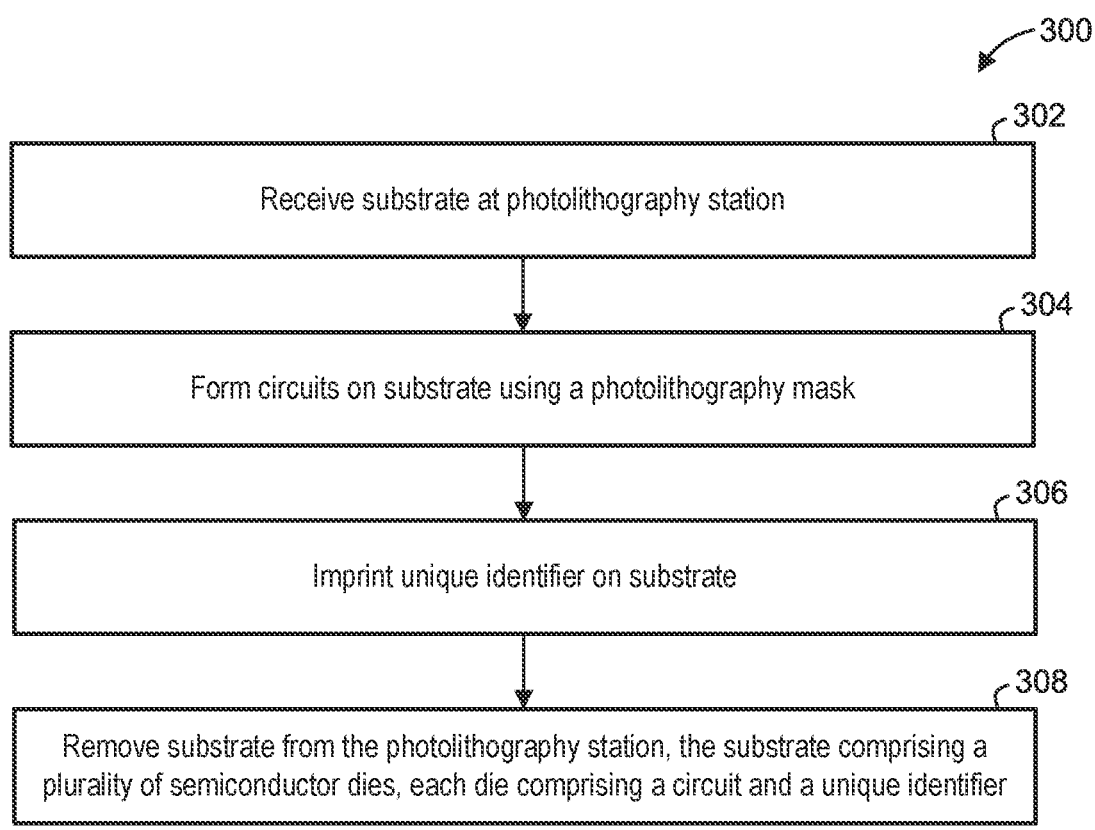
FIG. 3 is a flow chart of an example embodiment of a method for imprinting a unique identifier on a semiconductor die.

Referring now to FIG. 3, shown therein is flowchart 300 of an example method of imprinting a unique identifier on a semiconductor die. The method 300 may be performed by the system 100.

Figure 5A:
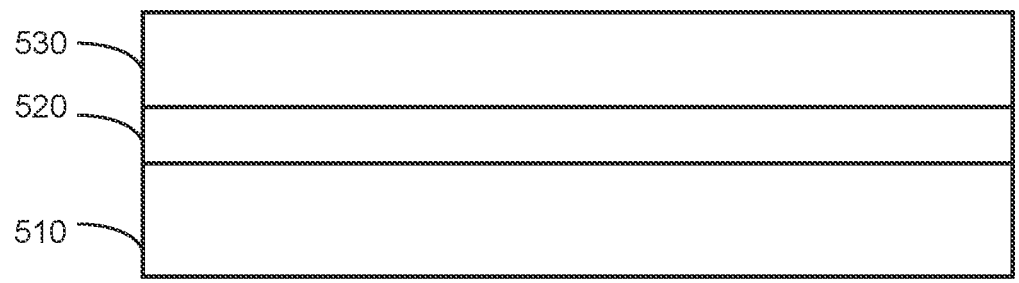
FIG. 5A is a schematic diagram showing a cross-sectional view of an example substrate receivable by the photolithography station in accordance with the present disclosure.

At step 302, the method 300 involves receiving a substrate layer at the photolithography station. The substrate can be received for example, at station 200. The substrate received can include one or more photosensitive layer(s) and an area for forming semiconductor dies. Referring briefly to FIG. 5A, which shows a cross-section of an example substrate that can be received at step 302, and the layers of the substrate, the substrate can include a substrate material 510 coated with thin film(s) 520 and a photoresist layer 530.

Figure 5B:
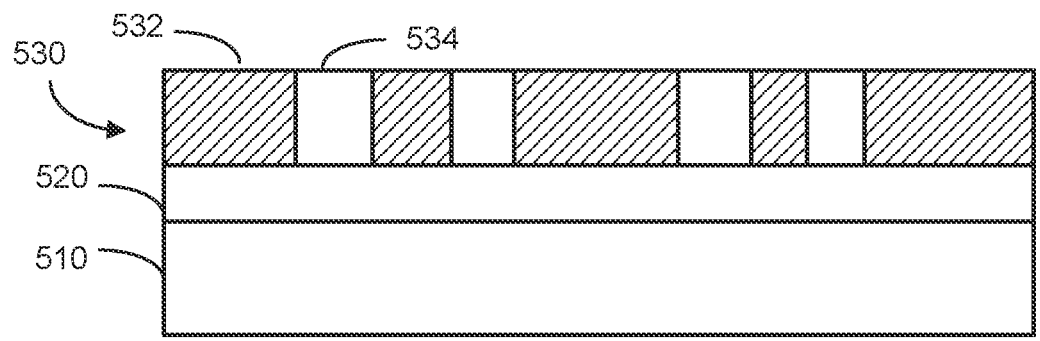
FIG. 5B. is a schematic diagram showing a cross-sectional view of another example substrate receivable by a photolithography station in accordance with the present disclosure.
Figure 5C:
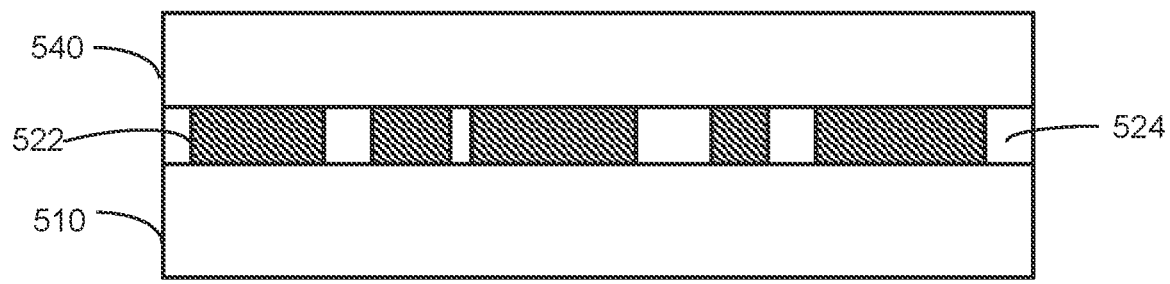
FIG. 5C is a schematic diagram showing a cross-sectional view of another example substrate receivable by a photolithography station in accordance with the present disclosure.

Alternatively, in at least one embodiment, the substrate received can include a plurality of regions, each region associated with a die and each region including a complete circuit or a partial circuit imprinted onto one or more thin films applied on the surface of the substrate. Referring briefly to FIG. 5C, which shows a cross-sectional view an example substrate that can be received at step 302 and the layers of the substrate, the substrate received can contain a plurality of identical circuits patterned on a layer of the substrate. In FIG. 5C, as the thin film 522 is patterned with an existing pattern, additional thin film(s) 524 and photoresist layer(s) 540 may be deposited at step 302 or prior to step 302. In some cases, the substrate may contain circuits that have not been developed (i.e., the substrate may contain photoresist material that has been patterned 532 and not patterned 534), as shown in FIG. 5B. The circuit may be imprinted by a method and system external to method 200 and/or system 100.

In some cases, the substrate received may not include a photoresist layer. In such cases, the method 300 can involve applying a photoresist layer to the substrate. The surface of the substrate material may be coated with a thin film and the photoresist may be deposited on the surface of the thin film.

As described, in some cases, the thin film on which the photoresist is deposited may be patterned with a complete circuit or a partial circuit such that the unique identifier is transferred onto a layer comprising the circuit or partial circuit. In other cases, the thin film may be a film that is not patterned. The photoresist layer may be deposited onto the substrate using any technique suitable for depositing a photoresist layer on a prepared substrate, including, for example, a spin-on technique. The photoresist may have a positive or a negative tone. The film may be a film of any material used in the manufacturing of semiconductor dies such as, but not limited to, semiconductor, ceramic and glass materials.

At step 304, the method 300 involves forming circuits on the substrate received at step 302. Each circuit can correspond to a semiconductor die. All of the circuits to be formed on the substrate may be formed at step 302. The circuits can be formed using photolithography mask(s), for example, conventional photolithography mask(s). In cases where the substrate received already contains partial circuits, step 304 can involve forming the remaining parts of the partial circuits.

At step 306, the method 300 involves imprinting the unique identifier on the substrate. A unique identifier can be imprinted on each semiconductor die. The unique identifier can be imprinted using digital photomask(s), such as photomask 246. For example, the photomask used at step 304 can be substituted prior to step 306 with a digital photomask, such that the substrate can remain within the photolithography station throughout the steps 304 and 306 (i.e., the circuits and the unique identifiers can be imprinted within the same photolithography station). As described with reference to FIG. 2, prior to imprinting each unique identifier, the pixels of the digital photomask can be set to form a unique pattern. The pattern can be controlled by a processor in communication with the digital photomask, as described with reference to FIG. 2. In some cases, step 304 can involve developing the circuits, in which case, prior to step 306, new thin film(s) may be deposited prior to step 306, similar to FIG. 5C. In other cases, step 304 may not involve developing the circuits formed, in which case the unique identifier may be imprinted on the same layer(s) of photoresist as the circuits formed at step 304, similar to FIG. 5B.

The unique identifier may be imprinted, using photolithography techniques which can allow for a design to be transfer onto a film using physical and/or chemical treatments. For example, if a positive tone photoresist is applied, imprinting the unique identifier can involve exposing a region of the photoresist applied to light to alter the photoresist such that that region of the photoresist is removed when developed, revealing the unique identifier. Alternatively, if a negative tone photoresist is applied, imprinting the unique identifier can involve exposing a region of the photoresist to light to strengthen the region corresponding to the identifier and later dissolving the regions of the photoresist not exposed to light through a developing process. The developing process can involve exposing the substrate to a developer solution to remove the exposed regions of the photoresist or the unexposed regions of the photoresist, depending on the tone of the photoresist. The film may then be etched to remove portions of the film not protected by the photoresist to reveal the unique identifier and the photoresist may be removed, preserving the unique identifier on a thin film on the substrate. In some cases, the developing and etching processes may involve revealing the unique identifier and the circuit or a portion of the circuit as part of the same step, for example, when a circuit or a portion of a circuit contained on the substrate has not been developed.

In some cases, the photoresist may be a permanent photoresist. The permanent photoresist may be for example, an epoxy, a benzocyclobutene (BCB) polymer, sol-gel or spin on-film photoresist. In such cases, the photoresist may not be removed.

The unique identifier can be imprinted on a region of the die that is not covered by a circuit. The position of the unique identifier may be determined based on the design of the circuit. In some cases, the unique identifier may be imprinted on an outer periphery of the portions of the substrate corresponding to each semiconductor die such that each semiconductor die includes a unique identifier. The identifier may be unique across the substrate and/or across all substrates such that no semiconductor die shares the same identifier.

The size of the identifier may depend on the size of the semiconductor die and/or of the circuit imprinted on the semiconductor die, the position of the circuit on the semiconductor die and/or the design of the circuit pattern. The size of the identifier may be selected to minimize the need for modifying the dimensions of the semiconductor die to accommodate the unique identifier.

The identifier may be imprinted in any two-dimensional code format, including but not limited to, a data matrix code, a QR code, an Aztec code, a flashcode or a Semacode. The two-dimensional code may be generated using known algorithms for generating unique two-dimensional codes and may be imprinted by activating pixels in a predetermined region of the die. The use of a two-dimensional code can require a smaller surface area on a die than the use of characters, which can also require a greater number of pixels to be activated.

In some cases, the method 300 may involve determining a position for the unique identifier prior to imprinting the unique identifier. The position may be determined based on the format of the identifier and the type of circuit design imprinted on the substrate. The position may be determined to minimize interference with the circuits imprinted on the substrate. The position may be determined during the design of the semiconductor die, for example, using design programs. Alternatively, the method 300 may involve determining a size and location of a circuit imprinted on the substrate subsequent to step 304 but prior to step 306, and determining a position for the unique identifier based on the size and location of the circuit imprinted on the substrate.

In some cases, steps 304 and 306 and may be performed iteratively until the desired pattern of circuits and unique identifiers is imprinted on the substrate. For example, the circuits and/or unique identifiers may be imprinted on several thin films and/or functional films may be interleaved with film(s) containing the unique identifiers. The photosensitive layer(s) can be removed in between each iteration and/or when the desired pattern is obtained.

At step 308, the method involves removing the substrate comprising the printed circuits and unique identifiers from the photolithography station. Once the substrate is removed from the photolithography station, the substrate may be singulated to obtain the semiconductor dies. Each semiconductor die extracted from the substrate may contain a unique identifier and a circuit design, which may be common to the semiconductor dies extracted from the substrate.

Figures 6A, 6B:
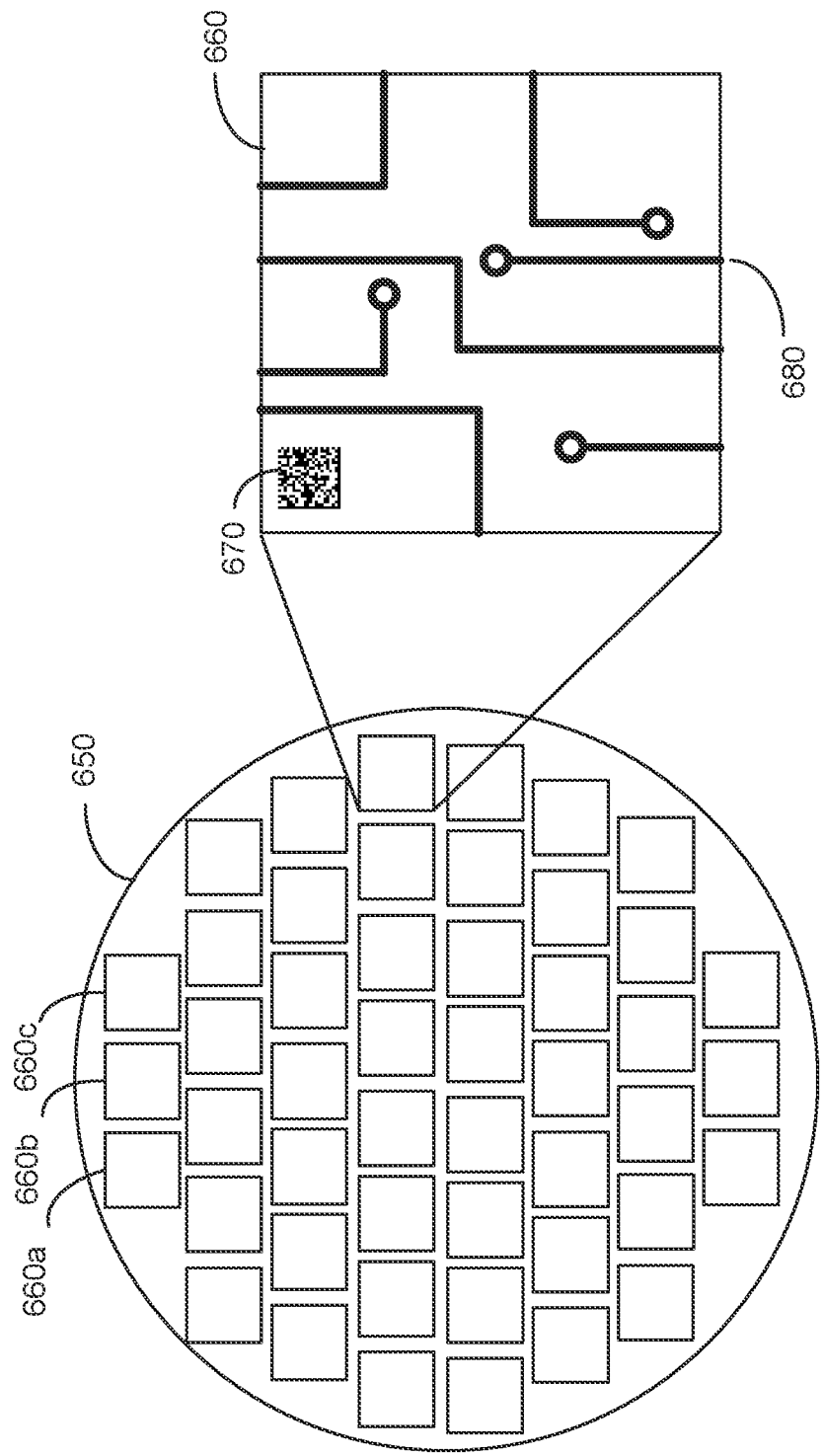
FIG. 6A is a schematic diagram of an example substrate on which semiconductor dies have been formed.
FIG. 6B is a close-up view of a semiconductor die of the example substrate of FIG. 6A.

Reference is now briefly made to FIGS. 6A and 6B, which show an example substrate on which semiconductor dies have been formed, and a close-up view of a semiconductor die, respectively. As shown, after steps 304 and 306, the substrate 650 contains areas defining semiconductor dies 660a, 660b, 660c and each area corresponding to a semiconductor die 660 contains a circuit 680 and a unique identifier 670.

In at least some embodiments, the method 300 additionally involves associating the unique identifier to a record for the semiconductor die. The record may be, for example, stored in a data storage, for example, external data storage 180 which may be accessed via a network. The record can include information about the semiconductor die, including, but not limited to a lot identification number, a batch of the semiconductor die and/or of the wafer, an origin of the wafer, a wafer number, a location of the die on the wafer, a size of the die, dimensions for the identifier, a thickness of the identifier, a type of material used for imprinting the identifier, a position of the identifier on the die, and a date and time of production of the die. In some cases, the record can be dynamic and may be updated to include event information as the die is processed further, for example, as the die is mounted on a frame to form a microchip and may provide a history of the die as it processes through the fabrication process. For example, the unique identifier may be read as the semiconductor die progresses through the manufacturing process, for example, when the microchip containing the semiconductor die is integrated into a final product or after characterization measurements are performed, and additional information may be recorded in the record associated with the unique identifier. The unique identifier may be read by any device capable suitable for reading a physical identifier on a die, for example, an optical microscope and devices using infrared microscopy techniques or X-ray tomography techniques. In some cases, additional characteristics of the unique identifier, including but not limited to, the position of the identifier, the thickness of the identifier and the dimensions of the identifier may be determined when reading the identifier.

In some cases, the record may be accessible via a platform that may be shared between stakeholders involved in the manufacturing, the assembly and the distribution of semiconductor dies and end users of the semiconductor die and/or products comprising semiconductor dies. For example, each stakeholder and/or end user may be associated with a profile that may allow records to be consulted and/or modified. This can allow for stakeholders to retrieve information about the semiconductor die, which can be used to assist stakeholders in making decisions by for example, aiding in supply chain forecasting and production scheduling.

The unique identifier may also be read by stakeholders or end users upon detection of a failure of the circuit to which the unique identifier is associated and/or malfunctioning of the circuit causing failure of a process. By accessing the record associated with the unique identifier, it may be possible to identify a root cause for the failure, for example, by identifying events in the fabrication history of the semiconductor die or to identify semiconductor dies that may be vulnerable to the same failure.

The data storage can be a secured data store that may be accessible to stakeholders and/or end users associated with a profile. Access may be based for example, on a type of profile and/or may be determined by the manufacturer and/or the owner of each semiconductor die. In some cases, accessing the record may involve providing information relating to one or more physical characteristics of the identifier, including, but not limited to, the position of the identifier on the die, the thickness of identifier and the dimensions of the identifier. Providing additional information relating to characteristics of the identifier may serve as an additional layer of authentication, for example, to ensure the die is in the possession of the user seeking to access the record associated with the die. In such cases, access to a record can involve providing the unique identifier for the semiconductor and providing one or more physical characteristics of the unique identifier. The data storage and/or the platform providing access to the data storage may then compare the one or more physical characteristics provided to the physical characteristics of the identifier recorded in the record associated with the unique identifier. Access to the record may be based on the result of the comparison.

Figure 4:
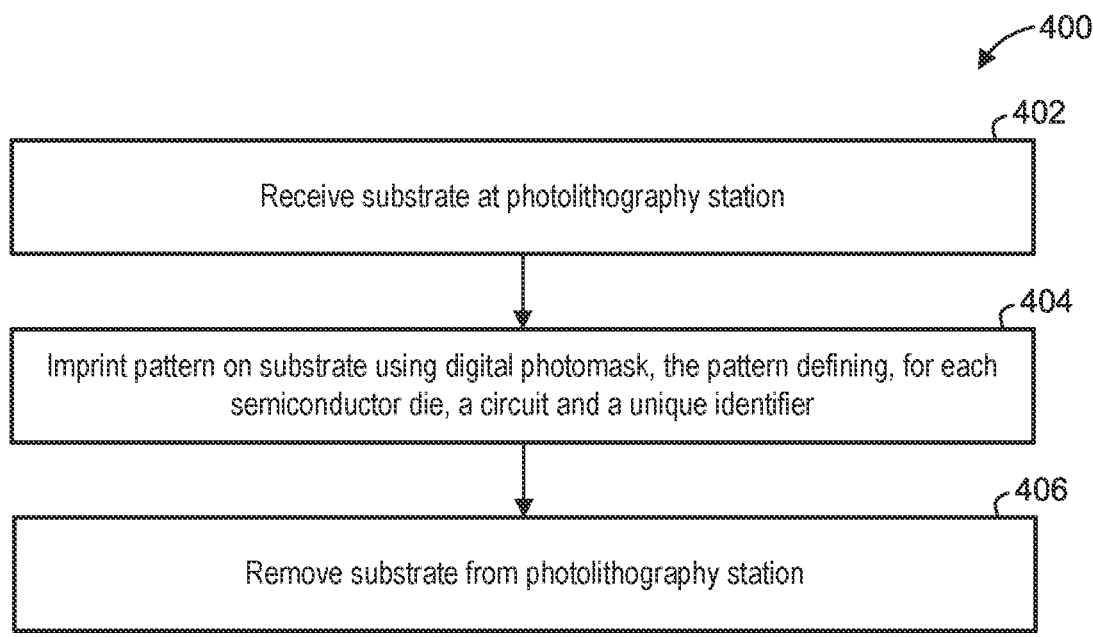
FIG. 4 is a flow chart of another example embodiment of a method for imprinting a unique identifier on a semiconductor die.

Referring now to FIG. 4, shown therein is flowchart of another example method 400 of imprinting a unique identifier on a semiconductor die. The method 400 may be performed by the system 100. Method 400 may be substantially similar to method 300. However, method 400 can involve imprinting the circuits and the unique identifiers using digital photomask(s). Similar to method 300, method 400 can involve forming the circuits and the unique identifiers within the same photolithography station and without removing the substrate from the photolithography station.

At step 402 the method 400 involves receiving a substrate at a photolithography station. The substrate can be received for example, at the photolithography station 200. The substrate received can be a substrate that has been prepared for microfabrication processes, including, for example, cleaned and coated with photosensitive layer(s). Similar to method 300, the substrate received can include a substrate material coated with thin film(s) and a photoresist layer though in some cases, the method 400 can involve applying a photoresist to the substrate. In such cases, the surface of the substrate received may be coated with a thin film and the photoresist may be deposited on the surface of the thin film. The photoresist layer may be deposited onto the substrate using any technique suitable for depositing a photoresist layer on a prepared substrate, including, for example, a spin-on technique. The photoresist may have a positive or a negative tone. The film may be a film of any material used in the manufacturing of semiconductor dies such as, but not limited to, semiconductor, ceramic and glass materials.

At step 404, the method involves imprinting a pattern including a circuit design and the unique identifier onto each region of the substrate received at step 402 corresponding to a die, such that the unique identifier can be imprinted within the same thin film layer or layers as the functional thin film layer(s) of the die. The pattern can be imprinted using digital photomask(s), such as the digital photomask 246. As described with reference to FIG. 2, prior to imprinting each unique identifier, the pixels of the digital photomask can be set to form a unique pattern. The pattern can be controlled by a processor in communication with the digital photomask, as described with reference to FIG. 2.

In at least one embodiment, some pixels of the digital photomask can define one or more static (i.e., passive) regions. The static region(s) can correspond to pixels that remain unchanged from one semiconductor die to another, that is, the pixels can form a pattern that remains unchanged. For example, the region(s) can correspond to the circuits, which may be identical from one die to another within the substrate. As described with reference to FIG. 2, the pixels may correspond to pixels which have been pre-programmed to remain unchanged. Alternatively, the pixels may be pixels which are not programmable (e.g., standard photomask regions). In such embodiments, the patterns formed across the semiconductor dies may contain an identical component and a component that varies from one die to another.

As described with reference to method 300, imprinting the pattern can involve exposing a region of the photoresist to light to alter the photoresist such that that region of the photoresist is removed when developed to reveal the pattern.

Alternatively, imprinting the pattern can involve exposing a region of the photoresist to light to strengthen the region corresponding to the pattern and later dissolving the regions of the photoresist not exposed to light during the developing process. The substrate may then be developed and etched, as described with reference to method 200. Step 404 may be performed by devices, machines or components typically used in manufacturing of semiconductor dies and the unique identifier may be imprinted in the same step or steps as the circuit.

As with method 300, in some cases, the photoresist may be a permanent photoresist. The permanent photoresist may be for example, an epoxy, a benzocyclobutene (BCB) polymer, sol-gel or spin on-film photoresist. In such cases, the photoresist may not be removed.

As compared to method 300, method 400 can improve yield and efficiency and decrease the risk of damage to the semiconductor die, as method 400 can reduce the number of layers and the number of processes performed on the substrate. Further, method 400 may not require substituting the photomask(s) during the manufacturing process of the semiconductor dies.

In some cases, the method 400 may involve determining a position for the unique identifier prior to imprinting pattern. The position may be determined to minimize interference with the circuits imprinted on the substrate. The position may be determined during the design of the semiconductor die, using design programs.

The unique identifier imprinted during method 400 may be substantially similar to the unique identifier of method 300.

In at least some embodiments, step 404 may be performed iteratively until the desired pattern is achieved on the substrate, such that multiple films and photoresists may be applied to the surface of the substrate or on the surface of existing films. At least some films may include a pattern including a combination of a partial circuit and a portion of the identifier. For example, at least the last film applied to the substrate may be patterned with a combination of a partial circuit and at least a portion of the identifier. In such embodiments, the state (i.e., ON or OFF) of at least some of the pixels of the digital photomask may be varied between each layer. When the desired pattern is obtained, the substrate may then be processed using known techniques for removing excess material including excess film, photoresist or substrate material. The substrate may alternatively, or in addition thereto, be processed between each iteration to remove excess photosensitive material.

At step 406, the method 400 involves removing the substrate containing the circuits and the unique identifiers from the photolithography station.

In at least some embodiments, the method further involves associating the unique identifier with a record associated with the semiconductor die. Each unique identifier imprinted on the substrate may be associated with a separate record. The record may be, for example, stored in a data storage, for example, external data storage 180 which may be accessed via a network. The record may be substantially similar to the record of method 200. In some cases, the record may be associated prior to steps any or all of steps 402, 404 and 406. For example, the unique identifier may be associated with a record at the time of designing the pattern for the semiconductor die.

Once the substrate is removed from the photolithography station, the substrate may be singulated to obtain the semiconductor dies. Each semiconductor die extracted from the substrate may contain a unique identifier and a circuit design, which may be common to a plurality of semiconductor dies extracted from the substrate. As described with reference to FIGS. 3 and 6A-6B, each of the semiconductor dies formed can contain a circuit and a unique identifier, identifying the semiconductor die.

The semiconductor dies may then be packaged using techniques known to those skilled in the art.

Imprinting the unique identifier on each semiconductor die prior to singulation can allow for the location of each die within the substrate to be recorded, which can allow for improved traceability and can improve identification of semiconductor dies which may be vulnerable to defects when a portion of a substrate is known to contain defects.

Figure 8:
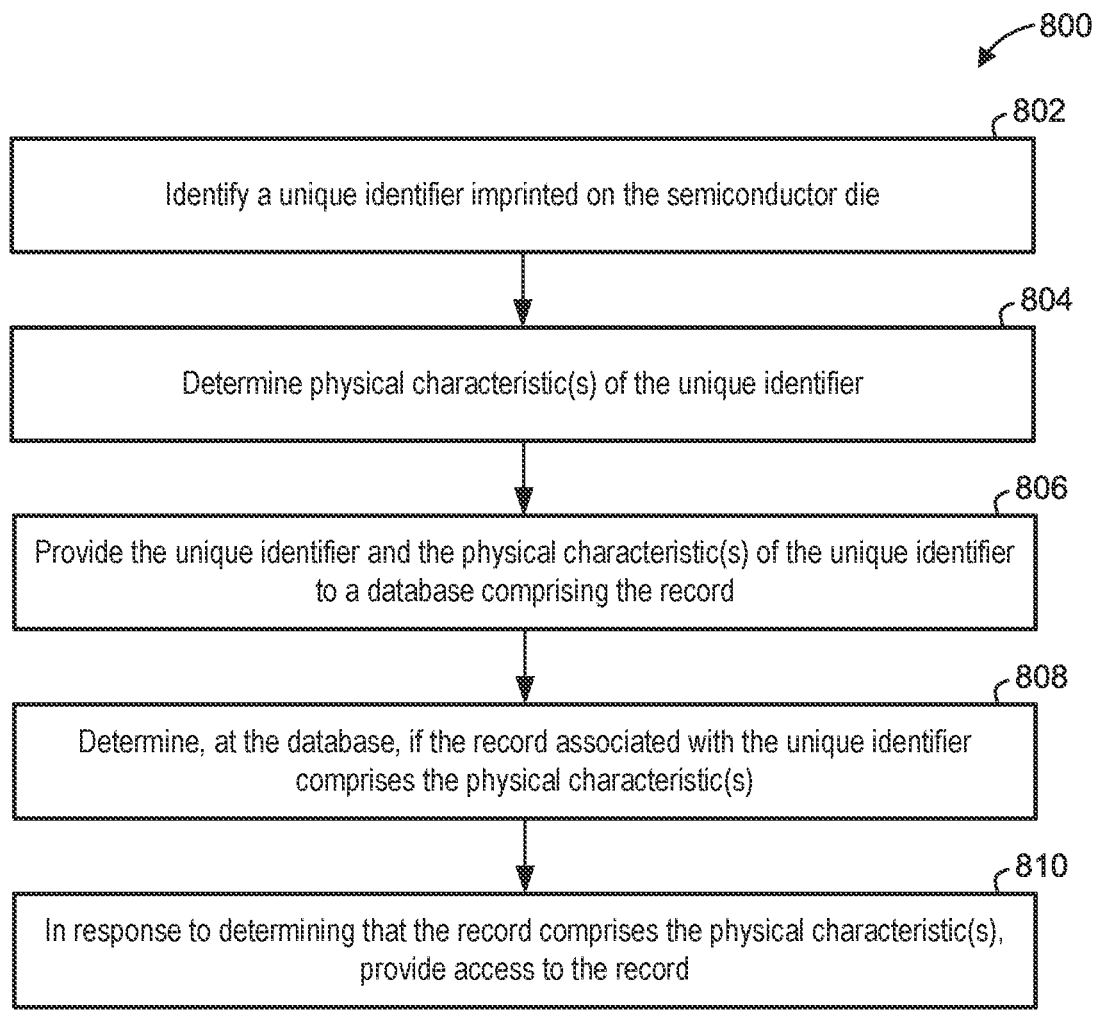
FIG. 8 is a flowchart of an example embodiment of a method for accessing a record associated with a semiconductor die.

Referring to FIG. 8, shown therein is a flowchart of an example method 800 of accessing a record associated with a semiconductor die. The record can correspond to for example, the records described with reference to methods 300 and 400 and can be a secured record.

At step 802, the method 800 involves identifying a unique identifier imprinted on a semiconductor die. For example, as described with reference to method 300, the unique identifier may be read using an optical microscope or device using infrared microscopy techniques or X-ray tomography techniques. The unique identifier may be electronically read by these devices.

At step 804, the method 800 involves determining physical characteristic(s) of the unique identifier. For example, measurements instruments and/or devices used or identifying the unique identifier may be used to determine the physical characteristic(s) of the unique identifier. Physical characteristic(s) can include but are not limited to the position of the identifier on the die, the thickness of identifier and the dimensions of the identifier.

At step 806, the method 800 involves providing the unique identifier as identified at step 802 and the physical characteristic(s) as determined at step 804 to a database or platform storing the record.

At step 808, the method 800 involves the database determining if the record associated with the unique identifier contains the physical characteristic(s) provided at step 806. For example, the record can include the physical characteristic(s) and a processor associated with the database can compare the physical characteristic(s) provided at step 806 with the physical characteristic(s) known to be associated with the unique identifier. The physical characteristic(s) of the unique identifier may be recorded at the time of creation of the record.

At step 810, the method 800 involves providing access to the record if the physical characteristic(s) provided at step 806 are contained within the record. For example, access to the record may be provided if the result of the comparison at step 808 indicates that the provided characteristic(s) and the recorded characteristic(s) match. Method 800 can ensure that the record associated with the semiconductor die is only accessed by individuals who have physical possession of the semiconductor die.

While the applicant's teachings described herein are in conjunction with various embodiments for illustrative purposes, it is not intended that the applicant's teachings be limited to such embodiments. On the contrary, the applicant's teachings described and illustrated herein encompass various alternatives, modifications, and equivalents, without generally departing from the embodiments described herein. For example, while the teachings described and shown herein may comprise certain elements/components and steps, modifications may be made as is known to those skilled in the art. For example, selected features from one or more of the example embodiments described herein in accordance with the teachings herein may be combined to create alternative embodiments that are not explicitly described. All values and sub-ranges within disclosed ranges are also disclosed. The subject matter described herein intends to cover and embrace all suitable changes in technology.

The invention claimed is:

1. A method for imprinting a unique identifier on a semiconductor die at a photolithography station, the method comprising:
  receiving the substrate at the photolithography station, the substrate comprising a photosensitive layer and an area for forming a plurality of semiconductor dies;
  forming, by a projector of the photolithography station, a plurality of circuits on the substrate using at least one photolithography mask, each circuit corresponding to a semiconductor die;
  providing, by a processor in communication with the photolithography station, a unique identifier for each die;
  imprinting, by the projector, the unique identifier on each semiconductor die on the substrate using at least one digital photomask, the at least one digital photomask comprising dynamically controlled pixels controllable to define a unique pattern for the unique identifier; and
  removing the substrate comprising the plurality of semiconductor dies from the photolithography station, each semiconductor die comprising the circuit and the unique identifier; wherein each unique identifier is stored in a record of a database for subsequent retrieval, each record comprising at least said unique identifier and information unique to the semiconductor die.

2. The method of claim 1, further comprising determining one or more of a position and a size of the unique identifier based on one or more of a position of the circuit and a pattern of the circuit for each of the semiconductor die.

3. The method of claim 1, wherein imprinting the unique identifier on each semiconductor die comprises imprinting the unique identifier on an outer periphery of the semiconductor die.

4. The method of claim 1, wherein the record comprises one or more of: an origin of the substrate, a lot of the semiconductor die, a lot of the substrate, a batch for the semiconductor die, a batch for the substrate, a position of the semiconductor die on the substrate, a size of the die, one or more dimensions for the unique identifier, a position of the unique identifier on the semiconductor die, a thickness of the unique identifier, a type of material for the unique identifier, and a fabrication history of the semiconductor die.

5. The method of claim 1, wherein imprinting the unique identifier comprises imprinting a unique two-dimensional code.

6. The method of claim 5, wherein the unique two-dimensional code is one of a data matrix code, a QR code, an Aztec code, a flashcode and a Semacode.

7. The method of claim 1, wherein imprinting the unique identifier comprises imprinting the unique identifier on a thin film comprising at least a portion of the circuit.

8. A system for imprinting a unique identifier on a semiconductor die, the system comprising:
  a processor operable to determine the unique identifier on the semiconductor die;
  a database in communication with the processor for storing a record associated with the unique identifier;
  a photolithography station in communication with the processor, the photolithography station configured to:
    receive a substrate comprising a photosensitive layer and an area for forming a plurality of semiconductor dies;
    form, by a projector, a plurality of circuits on the substrate using at least one photolithography mask, each circuit corresponding to a semiconductor die;
    providing, by a processor in communication with the photolithography station, a unique identifier for each die;
    imprint, by the projector, the unique identifier on each semiconductor die on the substrate using at least one digital photomask, the at least one digital photomask comprising dynamically controlled pixels wherein the processor is operable to control the pixels of the digital photomask to define a unique pattern for the unique identifier; and
    remove the substrate comprising the plurality of semiconductor dies from the photolithography station, each semiconductor die comprising the circuit and the unique identifier; wherein each unique identifier is stored in a record of a database for subsequent retrieval, each record comprising at least said unique identifier and information unique to the semiconductor die.

9. The system of claim 8, wherein the processor is further operable to determine one or more of a position and a size of the unique identifier based on one or more of a position of the circuit and a pattern of the circuit for each of the semiconductor dies.

10. The system of claim 8, wherein imprinting the unique identifier on each semiconductor die comprises imprinting the unique identifier on an outer periphery of the semiconductor die.

11. The system of claim 8, wherein the record comprises one or more of: an origin of the substrate, a lot of the semiconductor die, a lot of the substrate, a batch for the semiconductor die, a batch for the substrate, a position of the semiconductor die on the substrate, a size of the die, one or more dimensions for the unique identifier, a position of the unique identifier on the semiconductor die, a thickness of the unique identifier, a type of material for the unique identifier, and a fabrication history of the semiconductor die.

12. The system of claim 8, wherein imprinting the unique identifier comprises imprinting a unique two-dimensional code.

13. The system of claim 12, wherein the unique two-dimensional code is one of a data matrix code, a QR code, an Aztec code, a flashcode and a Semacode.

14. The system of claim 8, wherein imprinting the unique identifier comprises imprinting the unique identifier on a thin film comprising at least a portion of the circuit.

15. A method for imprinting a unique identifier on a semiconductor die at a lithography station, the method comprising:
  receiving the substrate at the photolithography station, the substrate comprising a photosensitive layer and an area for forming a plurality of semiconductor dies;
  providing, by a processor in communication with the photolithography station, the unique identifier for each die;
  imprinting, by a projector of the photolithography station, a pattern onto the substrate using at least one digital photomask, the pattern defining a circuit for each semiconductor die and a unique identifier for each semiconductor die and the at least one digital photomask comprising dynamically controlled pixels, controllable to define a unique pattern for the unique identifier; and removing the substrate from the photolithography station, the substrate comprising the plurality of semiconductor dies, each semiconductor die comprising the circuit and the unique identifier; wherein each unique identifier is stored in a record of a database for subsequent retrieval, each record comprising at least said unique identifier and information unique to the semiconductor die.

16. The method of claim 15, wherein the at least one digital photomask further comprises at least one region defining a static pattern of pixels.

17. The method of claim 15, further comprising determining one or more of a position and a size of the unique identifier based on one or more of a position of the circuit and a pattern of the circuit for each of the semiconductor dies.

18. The method of claim 15, wherein imprinting the pattern comprising the circuit and the unique identifier comprises imprinting the unique identifier on an outer periphery of the semiconductor die.

19. The method of claim 15, wherein the record comprises one or more of: an origin of the substrate, a lot of the semiconductor die, a lot of the substrate, a batch for the semiconductor die, a batch for the substrate, a position of the semiconductor die on the substrate, a size of the die, one or more dimensions for the unique identifier, a thickness of the unique identifier, a position of the unique identifier on the semiconductor die, a type of material for the unique identifier, and a fabrication history of the semiconductor die.

20. The method of claim 15, wherein the unique identifier is a unique two-dimensional code.

21. The method of claim 20, wherein the unique two-dimensional code is one of a data matrix code, a QR code, an Aztec code, a flashcode and a Semacode.

22. A system for imprinting a unique identifier on a semiconductor die, the system comprising:
 a processor operable to determine the unique identifier on the semiconductor die;
 a database in communication with the processor for storing a record associated with the unique identifier; and
 a photolithography station in communication with the processor, the photolithography station configured to:
  receive the substrate, the substrate comprising a photosensitive layer and an area for forming a plurality of semiconductor dies;
  imprint, by a projector of the photolithography station, a pattern onto the substrate using at least one digital photomask, the pattern defining a circuit for each semiconductor die and a unique identifier for each semiconductor die; and the at least one digital photomask comprising dynamically-controlled pixels, wherein the processor is operable to control the pixels to define a unique pattern for the unique identifier; and
  remove the substrate from the photolithography station, the substrate comprising the plurality of semiconductor dies, each semiconductor die comprising the circuit and the unique identifier; wherein each unique identifier is stored in a record of a database for subsequent retrieval, each record comprising at least said unique identifier and information unique to the semiconductor die.

23. The system of claim 22, wherein the at least one digital photomask further comprises at least one region defining a static pattern of pixels.

24. The system of claim 22, wherein the processor is further operable to determine one or more of a position and a size of the unique identifier based on one or more of a position of the circuit and a pattern of the circuit for each of the semiconductor dies.

25. The system of claim 22, wherein imprinting the pattern defining the circuit and the unique identifier comprises imprinting the unique identifier on an outer periphery of the semiconductor die.

26. The system of claim 22, wherein the record comprises one or more of: an origin of the substrate, a lot of the semiconductor die, a lot of the substrate, a batch for the semiconductor die, a batch for the substrate, a position of the semiconductor die on the substrate, a size of the die, one or more dimensions for the unique identifier, a thickness of the unique identifier, a position of the unique identifier on the semiconductor die, a type of material for the unique identifier, and a fabrication history of the semiconductor die.

27. The system of claim 22, wherein the unique identifier is a unique two-dimensional code.

28. The system of claim 27, wherein the unique two-dimensional code is one of a data matrix code, a QR code, an Aztec code, a flashcode and a Semacode.

* * * * *